(12) United States Patent
Gislon et al.

(10) Patent No.: US 10,991,844 B2
(45) Date of Patent: Apr. 27, 2021

(54) APPARATUS FOR ALIGNING A SOLAR CELL ELEMENT, SYSTEM FOR USE IN THE MANUFACTURE OF A SOLAR CELL ARRANGEMENT, AND METHOD FOR ALIGNING A SOLAR CELL ELEMENT

(71) Applicant: APPLIED MATERIALS ITALIA S.R.L., San Biagio di Callalta (IT)

(72) Inventors: Daniele Gislon, Venice (IT); Enrico Boscolo Marchi, Chioggia (IT); Roberto Boscheratto, San Fior (IT)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 0 days.

(21) Appl. No.: 16/094,655

(22) PCT Filed: May 6, 2016

(86) PCT No.: PCT/EP2016/060197
§ 371 (c)(1),
(2) Date: Oct. 18, 2018

(87) PCT Pub. No.: WO2017/190801
PCT Pub. Date: Nov. 9, 2017

(65) Prior Publication Data
US 2019/0109258 A1 Apr. 11, 2019

(51) Int. Cl.
*H01L 31/18* (2006.01)
*B25J 15/06* (2006.01)
(Continued)

(52) U.S. Cl.
CPC ........ *H01L 31/188* (2013.01); *B25J 15/0658* (2013.01); *H01L 21/67706* (2013.01); *H01L 31/042* (2013.01); *Y02E 10/50* (2013.01)

(58) Field of Classification Search
CPC .. G06F 3/0482; H01L 31/18; H01L 21/67109
See application file for complete search history.

(56) References Cited

U.S. PATENT DOCUMENTS

2009/0202727 A1 8/2009 Abas et al.
2010/0037932 A1 2/2010 Erez et al.
(Continued)

FOREIGN PATENT DOCUMENTS

EP 2439782 A1 4/2012
JP 2011-515827 A 5/2011
(Continued)

OTHER PUBLICATIONS

International Search Report and Written Opinion dated Jul. 6, 2016 for Application No. PCT/EP2016/060197.
(Continued)

*Primary Examiner* — Tracy Y. Li
(74) *Attorney, Agent, or Firm* — Patterson + Sheridan, LLP

(57) ABSTRACT

The present disclosure provides an apparatus for aligning a solar cell element. The apparatus includes a transfer device configured for moving the solar cell element from a first position on a transport device to a second position on a support device, a detection device configured to detect a first orientation of the solar cell element on the transport device and configured to detect a second orientation of the solar cell element held by the transfer device, and a controller configured to change an orientation of the solar cell element held by the transfer device based on at least one of the first orientation and the second orientation to align the solar cell element.

20 Claims, 5 Drawing Sheets

(51) Int. Cl.
    *H01L 21/677*     (2006.01)
    *H01L 31/042*     (2014.01)

(56) References Cited

U.S. PATENT DOCUMENTS

| | | | |
|---|---|---|---|
| 2012/0031463 A1* | 2/2012 | Schmaelzle | G06F 3/0482 |
| | | | 136/246 |
| 2013/0272833 A1 | 10/2013 | Duncan et al. | |
| 2014/0373892 A1* | 12/2014 | Bergmann | H01L 31/18 |
| | | | 136/244 |
| 2017/0155012 A1* | 6/2017 | Beckett | H01L 21/67109 |

FOREIGN PATENT DOCUMENTS

| | | |
|---|---|---|
| KR | 20100134498 A | 12/2010 |
| WO | 2009/129668 A1 | 10/2009 |
| WO | 2009/149211 A2 | 12/2009 |

OTHER PUBLICATIONS

Taiwan Search Report dated Apr. 4, 2018 for Application No. 106113856.

\* cited by examiner

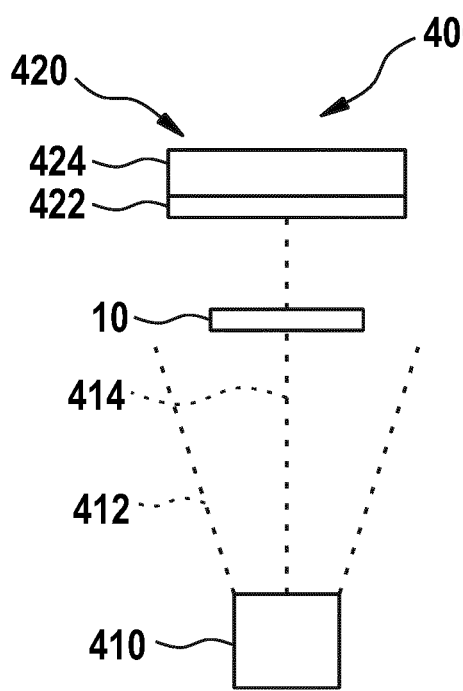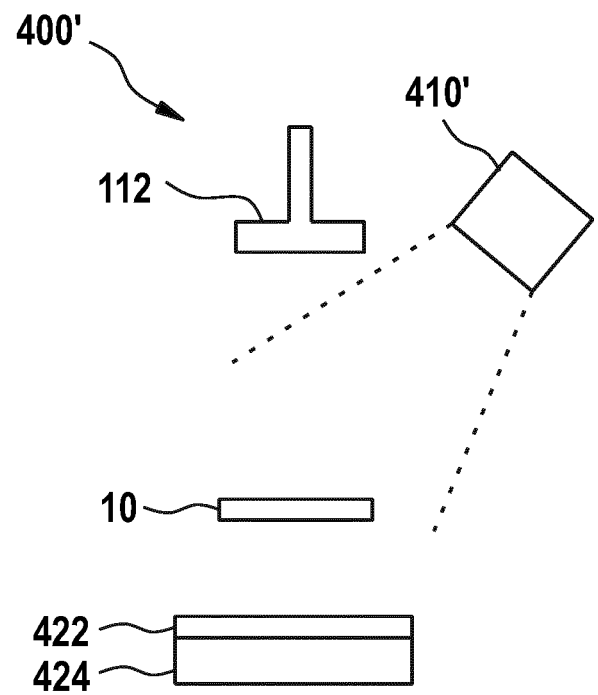
Fig. 4A               Fig. 4B
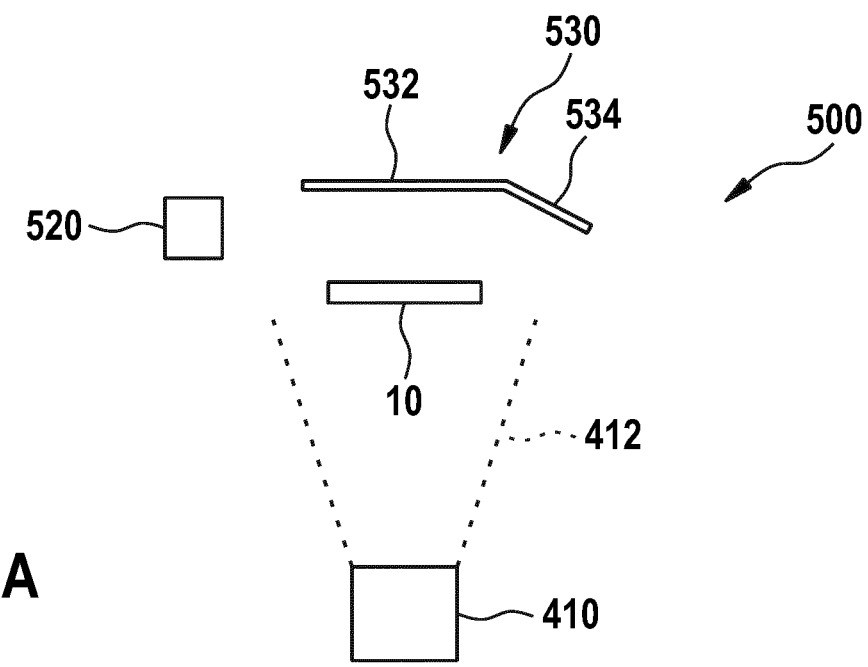
Fig. 5A

APPARATUS FOR ALIGNING A SOLAR CELL ELEMENT, SYSTEM FOR USE IN THE MANUFACTURE OF A SOLAR CELL ARRANGEMENT, AND METHOD FOR ALIGNING A SOLAR CELL ELEMENT

FIELD

Embodiments of the present disclosure relate to an apparatus for aligning a solar cell element, a system for use in the manufacture of a solar cell arrangement, and a method for aligning a solar cell element. Embodiments of the present disclosure particularly relate to an apparatus, system and method for aligning solar cell elements used in the manufacture of shingled solar cells.

BACKGROUND

Solar cells are photovoltaic devices that convert sunlight directly into electrical power. Within this field, it is known to produce solar cell modules of a series of solar cell elements. In order to provide high-quality solar cell modules, the individual solar cell elements of the solar cell module should be assembled in a correct and aligned manner. Since individual solar cell elements can be lightweighted, an accurate assembling can be challenging.

In view of the above, new apparatuses and methods for aligning solar cell elements and systems for use in the manufacture of solar cell arrangements, that overcome at least some of the problems in the art are beneficial. The present disclosure particularly aims at providing an improved alignment of solar cell elements used in the manufacture of solar cell modules and/or shingled solar cells.

SUMMARY

In light of the above, an apparatus for aligning a solar cell element, a system for use in the manufacture of a solar cell arrangement, and a method for aligning a solar cell element are provided. Further aspects, benefits, and features of the present disclosure are apparent from the claims, the description, and the accompanying drawings.

According to an aspect of the present disclosure, an apparatus for aligning a solar cell element is provided. The apparatus includes a transfer device configured for moving the solar cell element from a first position on a transport device to a second position on a support device, a detection device configured to detect a first orientation of the solar cell element on the transport device and configured to detect a second orientation of the solar cell element held by the transfer device, and a controller configured to change an orientation of the solar cell element held by the transfer device based on at least one of the first orientation and the second orientation to align the solar cell element.

According to a further aspect of the present disclosure, a system for use in the manufacture of solar cell arrangement is provided. The system includes the apparatus for aligning a solar cell element according to the embodiments described herein, the transport device configured to provide the first position, and the support device configured to provide the second position.

According to another aspect of the present disclosure, a method for aligning a solar cell element is provided. The method includes detecting a first orientation of the solar cell element positioned on a transport device, moving the solar cell element away from the transport device using a transfer device, detecting a second orientation of the solar cell element held by the transfer device, and changing an orientation of the solar cell element based on at least one of the first orientation and the second orientation to align the solar cell element.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following:

FIGS. 4A and B show schematic views of a detection device according to embodiments described herein;

FIG. 5A shows a schematic side view of a detection device according to further embodiments described herein;

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Solar cell modules can include one or more solar cell arrangements made of a series of solar cell elements, such as (full) solar cells or solar cell pieces. In order to provide solar cell modules having improved characteristics, such as an increased module power, the individual solar cell elements of the solar cell module should be assembled in an accurate manner.

The present disclosure uses a double-detection of an orientation of a solar cell element to improve an alignment of the solar cell element, for example, in a process of assembling a solar cell arrangement used in a solar cell module. In particular, the solar cell element is put on a support device, for example, to assemble the solar cell arrangement, wherein during the process of transferring the solar cell element to the support device an orientation of the solar cell element is detected at least twice in order to improve the transfer process. Specifically, the solar cell element can be brought into a predetermined orientation before the solar cell element is put on the support device.

Figure 1A:
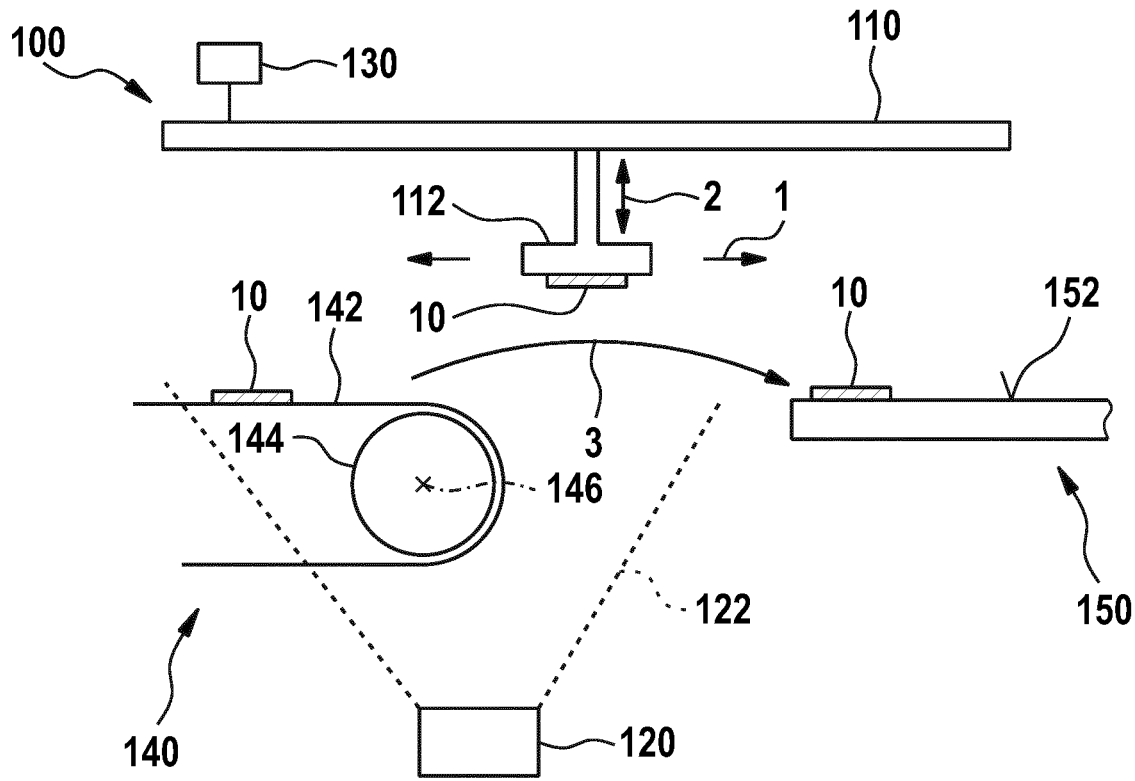
FIG. 1A shows a schematic side view of an apparatus for aligning a solar cell element according to embodiments described herein.
Figure 1B:
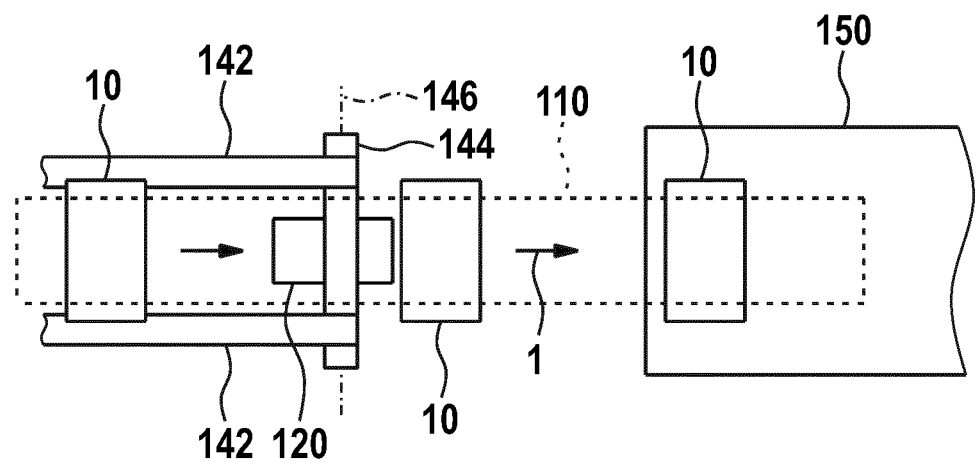
FIG. 1B shows a schematic top view of the apparatus of FIG. 1A.

FIG. 1A shows a schematic side view of an apparatus 100 for aligning a solar cell element 10 according to embodiments described herein. FIG. 1B shows a schematic top view of the apparatus 100 of FIG. 1A.

The apparatus 100 includes a transfer device 110 configured for moving the solar cell element 10 from a first position on a transport device 140 to a second position on a support device 150 (indicated with reference numeral 3), a detection device 120 configured to detect a first orientation of the solar cell element 10 on the transport device 140 and configured to detect a second orientation of the solar cell element 10 held by the transfer device 110, and a controller 130 configured to change an orientation of the solar cell element 10 held by the transfer device 110 based on at least one of the first orientation and the second orientation to align the solar cell element 10.

The apparatus 100 can align the orientation of the solar cell element 10 using the detection device 120 and the transfer device 110 such that the solar cell element 10 can be put on the support device 150 with a predetermined orientation. The term "orientation" as used throughout the present disclosure is to be understood in the sense of an orientation or alignment of the solar cell element in three-dimensional space. As an example, the orientation of the solar cell element can be defined using Cartesian coordinates.

In some embodiments, the apparatus 100 can be configured to determine the first orientation and/or the second orientation based on edges or corners of the solar cell element 10 detected by the detection device 120. As an example, a center of the solar cell element 10 can be calculated using the detected edges or corners of the solar cell element 10. The calculated center can then be used to align the solar cell element 10 held by the transfer device 110.

According to some embodiments, which can be combined with other embodiments described herein, the transfer device 110 includes a gripper 112 configured to grip and hold the solar cell element 10. The gripper 112 can be selected from the group consisting of a mechanical gripper, a pneumatic gripper, an electrostatic gripper, an electrodynamic gripper, a vacuum gripper, and any combination thereof. In some implementations, the gripper 112 can include one or more gripper elements. As an example, the gripper 112 can include two or more, such as three, four, five or six gripper elements configured for contacting and gripping the solar cell element 10. As an example, the one or more gripper elements can be suction cups configured to provide an under-pressure at a surface of the solar cell element 10 to hold the solar cell element 10 at the one or more gripper elements. The mechanical gripper can use mechanical devices, such as clamps, to hold the solar cell element 10 at the gripper 112. The electrostatic grippers and electrodynamic grippers can use an electrostatic force and an electrodynamic force, respectively, to hold the solar cell element 10 at the gripper 112.

The transfer device 110 can be configured to pick up the solar cell element 10 at, or from, the transport device 140 to move the solar cell element 10 from the first position to the second position. As an example, the controller 130 can control a movement of the transfer device 110 to move the solar cell element 10 to assemble, for example, a solar cell arrangement on the support device 150.

In some implementations, the transfer device 110, and particularly the gripper 112, is movable in at least one of a first direction 1 and a second direction 2. The first direction 1 can be a substantially horizontal direction. The second direction 2 can be a substantially vertical direction. The transfer device 110 can be movable sequentially or simultaneously in at least one of the first direction 1 and the second direction 2. By the movement in the first direction 1 and the second direction 2, the solar cell element 10 held by the transfer device 110 can be moved to the support device 150, for example, to assemble a solar cell arrangement on the support device 150.

As an example, the transfer device 110 can move in the second direction 2, for example, upwards, to pick up the solar cell element 10 at, or from, the transport device 140. The transfer device 110 can then move in the first direction 1, for example, forwards, to move the solar cell element 10 from the transport device 140 to the support device 150. The transfer device 110 can move in the second direction 2, for example, downwards, to place the solar cell element 10 on the support device 150, e.g., on a support surface 152 of the support device 150. The transfer device 110 can then move in the second direction 2 and the first direction 1, for example, back to the transport device 140 to pick up another solar cell element from the transport device 140. It is to be understood that the movement in the first direction 1 can be a movement in a forward direction and a backward direction. Likewise, the movement in the second direction 2 can be a movement in an upward direction and a movement in a downward direction.

The term "vertical direction" is understood to distinguish over "horizontal direction". That is, the "vertical direction" relates to a substantially vertical movement, wherein a deviation of a few degrees, e.g. up to 5° or even up to 10°, from an exact vertical direction is still considered as a "substantially vertical direction". The vertical direction can be substantially parallel to the force of gravity.

The transfer device 110, and particularly the gripper 112, can be configured to be movable for changing the orientation of the transfer device 110 and/or the solar cell element 10 held by the transfer device 110. In particular, the transfer device 110 can be movable to change an orientation of the solar cell element 10 held by the transfer device 110. Optionally, the transfer device 110 can be movable to change an orientation of the transfer device 110, and particularly of the gripper 112, before the solar cell element 10 is picked up at the transport device 140.

According to some embodiments, which can be combined with other embodiments described herein, the controller 130 is configured to change an orientation of the transfer device 110 based on the first orientation of the solar cell element 10 on the transport device 140 before picking up the solar cell element 10 from the transport device 140. As an example, the transfer device 110, and particularly the gripper 112 of the transfer device 110, can move into an orientation aligned with respect to the first orientation of the solar cell element 10. The transfer device 110 can be aligned with respect to the solar cell element 10 to provide for an improved gripping action. Bad or failing gripping actions, for example, due to one or more gripping devices, such as suction cups, of the transfer device 110 being outside the surface of the solar cell element 10 that is to be contacted for gripping the solar cell element 10, can be prevented. The determining of the first orientation can particularly be beneficial when the solar cell elements 10 are light-weighted solar cell elements and are likely to move on the transport device 140, for example, while being transported by the transport device 140 towards the first position.

According to some embodiments, which can be combined with other embodiments described herein, the controller 130 is configured to change an orientation of the transfer device 110 based on the first orientation and/or the second orientation of the solar cell element 10. In one example, the controller 130 is configured to change an orientation of the transfer device 110, and particularly of the gripper 112, based on the first orientation of the solar cell element 10 before picking up the solar cell element 10 from the transport device 140 as described above. The controller 130 can further be configured to change an orientation of the solar cell element 10 held by the transfer device 110, for example, by a movement of the transfer device 110 or the gripper 112, based on the second orientation of the solar cell element 10 before the solar cell element 10 is placed on the support device 150.

For instance, the first orientation of the solar cell element 10 on the transport device 140 is detected, the gripper 112 is aligned with respect to the solar cell element 10 based on the first orientation, the solar cell element 10 is then picked up from the transport device 140, the second orientation of the solar cell element 10 held by the gripper 112 is detected, and the solar cell element is (fine)-aligned based on the second orientation.

In other examples, the controller 130 is configured to change an orientation of the solar cell element 10 held by the transfer device 110, for example, by a movement of the transfer device 110 or the gripper 112, based on (e.g., a combination of) the first orientation and the second orientation of the solar cell element 10 before the solar cell element 10 is placed on the support device 150.

For instance, the first orientation of the solar cell element 10 on the transport device 140 is detected, the solar cell element 10 is picked up from the transport device 140, and the second orientation of the solar cell element 10 held by the gripper 112 is detected. The solar cell element 10 can be aligned based on the first orientation and the second orientation while the solar cell element 10 is held by the gripper 112. As an example, the solar cell element 10 held by the gripper 112 can roughly be aligned using the first orientation, the second orientation can then be detected, and a fine-alignment of the solar cell element 10 held by the gripper 112 can be conducted based on the second orientation.

In some implementations, the transfer device 110, and particularly the gripper 112, is movable a plane, such as a substantially horizontal plane. Such a movement can also be referred to as "Θ movement". As an example, the transfer device 110 can be configured to adjust or align an angular orientation of the solar cell element 10 held by the transfer device 110 in the plane. The angular orientation of the solar cell element 10 can be aligned, for example, with respect to the support device 150 and/or another solar cell element on the support device 150 with which the solar cell element 10 held by the transfer device 110 is to be overlapped to form a solar cell arrangement as described with respect to FIG. 3. The solar cell arrangement can be accurately assembled, and a quality of the solar cell arrangement can be improved.

According to some embodiments, the transfer device 110 can be configured to rotate the solar cell element 10 around a substantially vertical rotational axis by about 180°. As an example, edge pieces of pseudo-square solar cells having rounded edges can be brought into similar or substantially identical orientations. As an example, one edge piece (e.g., the front or leading edge piece) of the pseudo-square solar cell is not rotated by about 180° and the other edge piece (e.g., the back or trailing edge piece) of the pseudo-square solar cell is rotated by about 180° such that the geometric shapes of the edge pieces are equally oriented or aligned. The second orientation of the solar cell element 10 can be determined after the solar cell element 10 has been rotated around the substantially vertical rotational axis.

According to some embodiments, the transfer device 110, and particularly the gripper 112, is tiltable, for example, with respect to the first direction 1 and/or a horizontal plane. As an example, the transfer device 110 can tilt the solar cell element 10 held by the transfer device 110 to align an orientation of the solar cell element 10 with respect to another solar cell element on the support device 150 with which the solar cell element 10 held by the transfer device 110 is to be overlapped. In particular, the backside or backside plane of the solar cell element 10 held by the transfer device 110 can be oriented to be substantially parallel to a frontside or frontside plane of the other solar cell element on the support device 150. In some implementations, the transfer device 110 is configured to align a backside contact of the solar cell element 10 with respect to a frontside contact, such as a busbar, of another solar cell element on the support device 150 such that an electrical contact between the backside contact and the frontside contact can be established, for example, with an adhesive provided therebetween.

The apparatus 100 includes the detection device 120 configured to detect the first orientation of the solar cell element 10 on the transport device 140 and configured to detect the second orientation of the solar cell element 10 held by the transfer device 110. As an example, the detection device 120 can include one or more detection elements, such as one or more cameras, configured to detect the solar cell element 10 on the transport device 140 and the solar cell element 10 held by the transfer device 110. As an example, one detection element of the detection device 120 is configured for detecting both the first orientation and the second orientation. In other examples, a first detection element (e.g., a first camera) of the detection device 120 is configured for detecting the first orientation and a second detection element (e.g., a second camera) of the detection device 120 is configured for detecting the second orientation of the solar cell element 10.

In some implementations, the one or more detection elements have a field of view 122. The one or more detection elements can be positioned such that the solar cell element 10 is within the field of view 122 of the one or more detection elements when the solar cell element 10 is at least in the first orientation and the second orientation. As an example, one detection element of the detection device 120 can have a field of view extending sufficiently for detecting both the first orientation and the second orientation. In another example, the first detection element can have a first field of view configured for detecting the first orientation and the second detection element can have a second field of view configured for detecting the second orientation.

According to some embodiments, which can be combined with other embodiments described herein, the detection device 120 is configured to detect at least one edge or corner of the solar cell element 10 to detect the first orientation and/or the second orientation. As an example, the detection device 120 can be configured to detect the at least one edge or corner to determine at least a part of a contour or silhouette of the solar cell element 10 to determine the first orientation and/or the second orientation. Additionally or alternatively, the detection device 120 is configured to detect printing features on the solar cell element 10 to determine the first orientation and/or the second orientation. The printing features can be, for example, fingers, busbars and/or fiducials.

In some implementations, the detection device 120 includes at least one of one or more cameras and one or more light source devices. Embodiments of such detection devices are described with respect to FIGS. 4 and 5. The one or more light source devices can be configured to illuminate the solar cell element 10 in the first orientation and/or the second orientation. The one or more light source devices can also be referred to as "illuminator". The illumination can increase a contrast. The at least one edge can be detected more accurately, e.g., for determining at least a part of a contour or silhouette of the solar cell element 10.

According to some embodiments, which can be combined with other embodiments described herein, the transport device 140 can include, or be, a belt conveyor having a roller 144 rotatable around a rotational axis 146 and one or more belts 142 (also referred to as "pickup belt") provided on the roller 144. In some implementations, the transport device 140 can have two or more belts arranged in parallel and with gaps provided between the two or more belts, as it is shown in the top view of FIG. 1B.

According to some embodiments, which can be combined with other embodiments described herein, one or more cameras of the detection device 120 are arranged below the transport device 140 and/or the transfer device 110 is arranged above the transport device 140. As an example, at least part of the detection device 120, and specifically the one or more detection elements such as the one or more cameras, can be arranged below the transport device 140. The gap(s) provided between the two or more belts of the transport device 140 can allow that the solar cell element 10 can be detected by the detection device 120 through the gap(s). In particular, the one or more cameras can "see" the solar cell element 10 in the first orientation through the gap(s) between the two or more belts. In some implementations, the transfer device 110 can be provided above the transport device 140 and/or the detection device 120, particularly the one or more detection elements, can be provided below the transport device 140. In other words, the transport device 140 can be arranged at a position between the transfer device 110 and the detection device 120.

According to some embodiments, which can be combined with other embodiments described herein, the support device 150 includes, or is, at least one of an electrostatic or electrodynamic chuck and a vacuum chuck. The electrostatic or electrodynamic chuck can use an electrostatic or electrodynamic force, respectively, to hold the solar cell element 10 or solar cell arrangement at the support surface 152. The vacuum chuck can include a support surface 152 configured to support the solar cell element 10 or at least one solar cell arrangement including the solar cell element 10, wherein the support surface 152 can have at least one of holes and recesses connected to a suction device, such as a vacuum pump, in order to generate an under pressure in the holes and/or recesses to hold the solar cell element 10 or solar cell arrangement at the support surface 152.

The transfer device 110 is configured for moving or transferring the solar cell element 10 from the transport device 140, i.e., the first position, to the support device 150, i.e., the second position. As an example, the transfer device 110 can sequentially grip or pick up the solar cell element 10 at the transport device 140, move the solar cell element 10 to the support device 150, align the solar cell element 10, for example, during the movement to the support device 150, and release the solar cell element 10 at the support device 150 in a predetermined position. In particular, the transfer device 110 can be configured to arrange a plurality of solar cell elements including the solar cell element 10 in an overlapping manner to form a solar cell arrangement, such as a shingled solar cell.

According to an aspect of the present disclosure, a system for use in the manufacture of solar cell arrangement, such as a shingled solar cell, is provided. The system includes the apparatus 100 for aligning a solar cell element according to the embodiments described herein, the transport device 140 configured to provide the first position, and the support device 150 configured to provide the second position. In some implementations, at least one of the transport device 140 and the support device 150 are selected from the group consisting of a conveyor belt, a vacuum chuck, an electrostatic chuck, an electrodynamic chuck, and any combination thereof.

The first position can be provided when the solar cell element 10 rests on the transport device 140, for example, on the one or more belts 142. In particular, in some embodiments, the solar cell element 10 does not move with respect to the transport device 140 in the first position. The second position can be provided when the solar cell element 10 rests on the support device 150. In particular, in some embodiments, the solar cell element 10 does not move with respect to the support device 150 in the second position. Yet, this does not exclude any movement of the transport device 140, for example, the one or more belts 142, and the support device 150 when the solar cell element 10 is positioned thereon.

Figure 2:
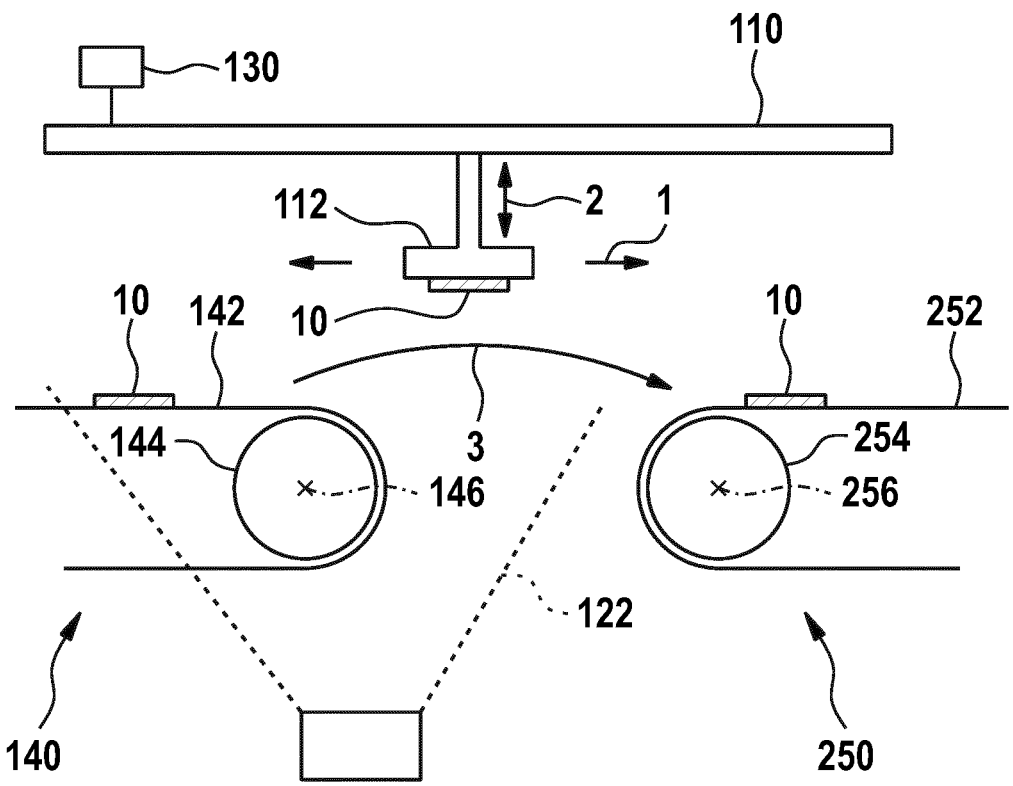
FIG. 2 shows a schematic side view of an apparatus for aligning a solar cell element according to further embodiments described herein.

FIG. 2 shows a schematic side view of an apparatus for aligning a solar cell element 10 according to further embodiments described herein. The apparatus of FIG. 2 is similar to the apparatus described with respect to FIGS. 1A and B, and a description of similar or identical aspects is not repeated.

According to some embodiments, the support device 250 can include, or be, a belt conveyor. The support device 250, e.g., the belt conveyor, is configured to support, fix and transport the solar cell element 10 or the solar cell arrangement including the solar cell element 10. In particular, the support device 250 can be configured for transportation of the solar cell element 10 or the solar cell arrangement including the solar cell element 10 in a transport direction 4, which can be a substantially horizontal direction.

The belt conveyor constituting the support device 250 can include a roller 254 rotatable around a rotational axis 256 and one or more belts 252 provided on the roller 254. In some implementations, the support device 250 can have two or more belts arranged in parallel and with gaps provided between the two or more belts. As an example, each belt of the two or more belts can be configured to support one solar cell arrangement of at least two solar cell arrangements. In other implementations, the support device 140 has one single belt on which the at least two solar cell arrangements, such as three solar cell arrangements, can be assembled in parallel.

In some implementations, a movement of the support device 250, and in particular a movement of the one or more belts 252, and a movement of the transfer device 110 can be synchronized with each other, for example, during the assembling of the solar cell arrangement on the support device 250. Additionally or alternatively, a movement of the transport device 140, for example, the one or more belts 142, and a movement of the transfer device 110 and/or the one or more belts 252 of the support device 250 can be synchronized with each other. By synchronizing at least some of the movements, a continuous process flow for assembling of the solar cell arrangement can be provided.

Figure 3:
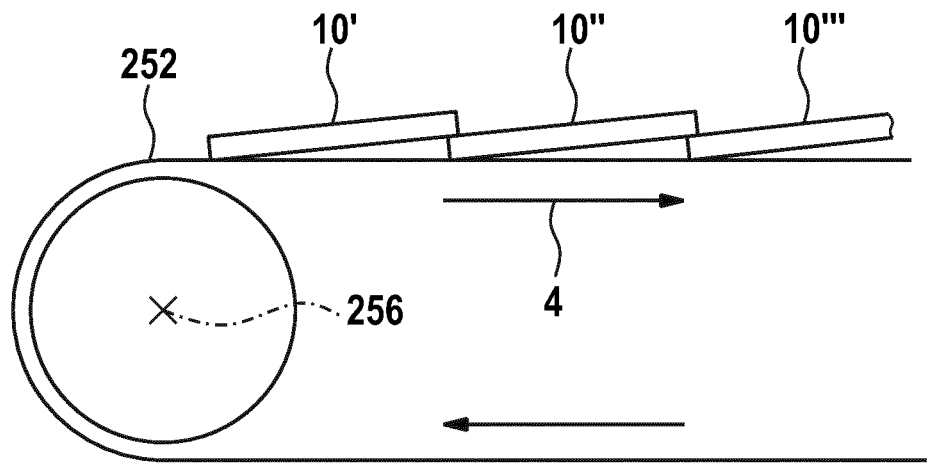
FIG. 3 shows a schematic view of overlapping solar cell elements on a support device according to embodiments described herein.

FIG. 3 shows a schematic view of overlapping solar cell elements 10', 10", 10"' on a support device 250 according to embodiments described herein.

The apparatuses, systems and methods of the present disclosure can be configured to manufacture or assemble solar cell arrangements on the support device 250. The solar cell arrangements of the present disclosure can be shingled solar cells, which can also be referred to as "hypercells" or "supercells". The solar cell arrangements can be used in solar cell modules. The solar cell arrangements can be made of a plurality of partially overlapping solar cell elements 10', 10", 10"' (also referred to as "solar cell pieces"). Adjacent solar cell elements are electrically connected to each other in the overlapping region. The solar cell elements are connected in series such that current generated by the individual solar cell elements flows along the series of solar cell elements to be collected, for example, at an end portion of the solar cell arrangement. The overlapping configuration can provide high-efficiency solar cell arrangements. In particular, the solar cell arrangements allow to increase a module power by increasing a used or active area. Typically, the overlapping configuration can increase the module power by, for example, 20 to 40 Watts. The used or active area can correspond to an area that is irradiated by solar light and that participates in the generation of power. As an example, the used or active area can correspond to an area of the solar cells that is not covered by, for example, conductive line patterns, such as fingers and/or busbars.

In some implementations, an adhesive, such as an electrically conductive adhesive, can be provided to connect to solar cell elements in the overlapping region. Two solar cell elements can be overlapped with the adhesive being provided at one solar cell element of the two solar cell elements such that the two solar cell elements can be electrically and mechanically connected to each other. According to some embodiments, the adhesive is an electrically conductive adhesive selected from the group consisting of solder, silver paste, and an electrically conductive silicone adhesive.

FIG. 4A shows a schematic view of a detection device 400 according to embodiments described herein.

According to some embodiments, which can be combined with other embodiments described herein, the detection device 400 includes one or more light source devices 420 and one or more cameras 410. The one or more light source devices 420 can provide for an illumination system that can improve an image quality of the images taken by the one or more cameras 410. The one or more light source devices 420 can include one or more light sources 422 arranged in direct line of sight 414 to the one or more cameras 410.

As an example, the one or more cameras 410 can have a field of view 412 in which the one or more light source devices 420 are positioned. For detecting the first orientation and/or the second orientation of the solar cell element 10, the solar cell element 10 can be provided at a position within the field of view 412 between the one or more light source devices 420 and the one or more cameras 410. In particular, the solar cell element 10 can be provided at a position on the direct line of sight 414. The arrangement using the direct line of sight 414 for detecting the first orientation and/or the second orientation of the solar cell element 10 can improve a contrast such that an edge or contour of the solar cell element 10 can be determined more precisely.

The one or more light sources are selected from the group consisting of lamps, light tapes, flash lights, and any combination thereof. As an example, the one or more light sources 422 can be light tapes fixed to a support 424, such as a plastic support. The light tapes are beneficial in that the light tapes provide an extended illumination area which can be larger than a surface area of the solar cell element 10. In other words, when seen from the camera's perspective, the light tape(s) can protrude over at least one edge of the solar cell element 10. The one or more cameras 410 can "see" a part of the light tapes that are not covered by the solar cell element 10. An improved contrast can be provided, and an edge or contour of the solar cell element 10 can be detected in an accurate manner.

FIG. 4B shows a schematic view of a detection device 400' according to further embodiments described herein.

According to some embodiments, which can be combined with other embodiments described herein, one or more cameras 410' of the detection device are arranged laterally with respect to at least one of the transport device and the transfer device. As an example, the one or more cameras 410' of the detection device can be positioned (e.g., horizontally) adjacent to the gripper 112 of the transfer device.

Figure 5B:
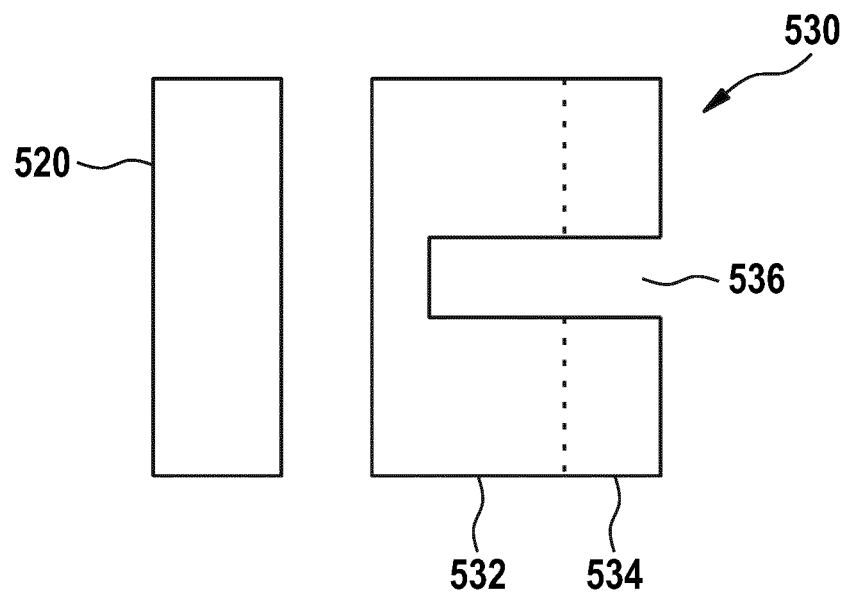
FIG. 5B shows a schematic top view of the detection device of FIG. 5A.

FIG. 5A shows a schematic side view of a detection device 500 according to further embodiments described herein. FIG. 5B shows a schematic top view of the detection device 500 of FIG. 5A.

According to some embodiments, which can be combined with other embodiments described herein, the one or more light source devices include one or more light sources 520 and one or more light diffusion devices 530. The one or more light diffusion devices 530 are arranged in direct line of sight to the one or more cameras 410, similar to the one or more light source devices described with respect to FIG. 4. In particular, the one or more light diffusion devices 530 can be positioned within the field of view 412 of the one or more cameras 410 and/or on the direct line of sight 414.

The one or more light sources 520 are configured to direct light towards the one or more light diffusion devices 530. As an example, the one or more light diffusion devices 530 are configured to defuse or redirect light emitted from the one or more light sources 520 towards the one or more cameras 410. According to some embodiments, the one or more light diffusion devices 530 can be made of, or covered with, a light reflective material. With the one or more light diffusion devices 530 being arranged in the direct line of sight 414 for directing light emitted from the one or more light sources 520 towards the solar cell element 10, a contrast can be improved such that an edge or contour of the solar cell element 10 can be determined more precisely.

The one or more light sources 520 can be laterally positioned with respect to the one or more light diffusion devices 530. As an example, the one or more light sources 520 and the one or more light diffusion devices 530 can be positioned along a substantially horizontal line. The one or more light diffusion devices 530 and the one or more cameras 410 can be positioned along a substantially vertical line.

In some implementations, the one or more light diffusion devices 530 can include a first light diffusion element 532 and a second light diffusion element 534. As an example, the second light diffusion element 534 can extend from the first light diffusion element 532, for example, angled or bent downward towards the one or more cameras 410. The one or more light diffusion devices 530, and particularly the first light diffusion element 532 and/or the second light diffusion element 534, can be light diffusion plates made of, or covered with, the light reflective material.

The first light diffusion element 532, such as a first light diffusion plate, can have a substantially parallel orientation with respect to a surface of the solar cell element 10. The second light diffusion element 534, such as a second light diffusion plate, can have a substantially non-parallel orientation with respect to the surface of the solar cell element 10. As an example, a reflecting surface of the first light diffusion element 532 can be substantially parallel to a horizontal plane. A reflecting surface of the second light diffusion element 534 can be tilted with respect to the horizontal plane. In particular, the reflective surface of the second light diffusing element 534 can be angled or bent towards the one or more cameras 410. An angle between the reflecting surface of the second light diffusion element 534 and the horizontal plane can be in a range of between 10° and 70°, specifically in a range of between 30° and 60°, and can more specifically be about 45°.

The term "substantially parallel" relates to a substantially parallel orientation e.g. of the first light diffusion element 532 and the horizontal plane, wherein a deviation of a few degrees, e.g. up to 2° or even up to 5°, from an exact parallel orientation is still considered as "substantially parallel".

In some implementations, the orientation or angle of the second light diffusion element 534 e.g. with respect to the horizontal plane can be selected such that the reflecting surface of the second light diffusion element 534 can directly be illuminated by the one or more light sources 520. Alternatively or additionally, the orientation or angle of the second light diffusion element 534 e.g. with respect to the horizontal plane can be selected such that the light emitted by the one or more light sources 520 is directed towards the solar cell element 10 for detecting the first orientation and/or the second orientation.

According to some embodiments, the one or more light sources 520 are selected from the group consisting of lamps, light tapes, flash lights, light bars (also referred to as "illuminator bars") and any combination thereof. In some implementations, the one or more light sources 520 can be flash lights configured to emit flashes towards the one or more light diffusion devices 530. As an example, the one or more light sources 520 can be configured to emit at least one flash for determining an orientation of the solar cell element 10. In particular, the one or more light sources 520 can be configured to emit at least one first flash for determining the first orientation of the solar cell element 10 on the transport device. The one or more light sources 520 can be configured to emit at least one second flash for determining the second orientation of the solar cell element 10 held by the transfer device. Such a "double flash" process can be used to align the solar cell element 10 that is to be put on the support device.

Referring to FIG. 5B, the one or more light diffusion devices 530 can include an engagement portion 536, such as a cutout. The engagement portion 536 can be configured such that at least part of the transfer device, and particularly the gripper thereof, can move into the engagement portion 536. The engagement portion 536 can be configured such that the solar cell element 10 held by the transfer device can be positioned such that the second orientation can be determined. In particular, the engagement portion 536 can be provided such that the solar cell element 10 held by the transfer device can be positioned within the field of view of the one or more cameras and/or on the direct line of sight between the one or more cameras and the one or more light diffusion devices 530.

Figure 6:
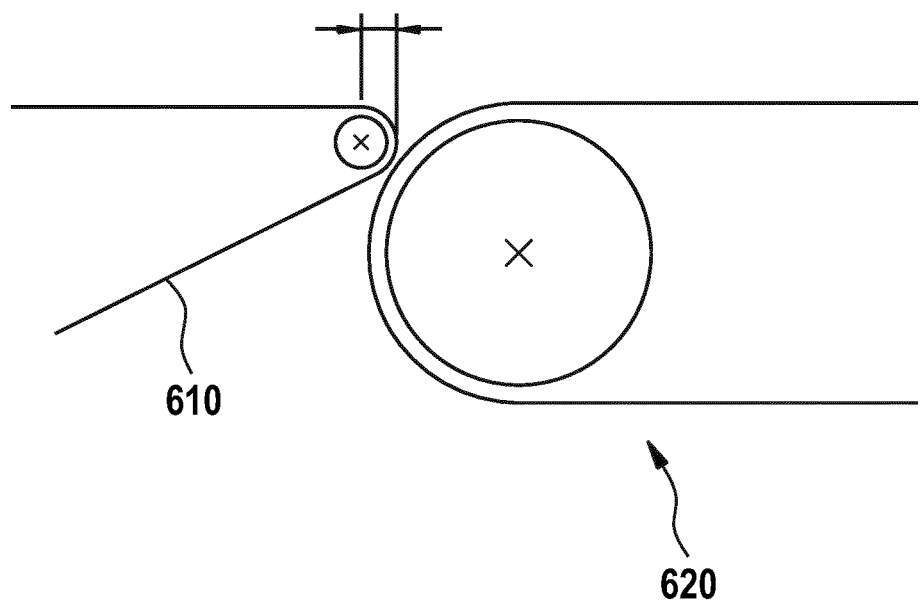
FIG. 6 shows a schematic side view of a transport device and a support device according to embodiments described herein.

FIG. 6 shows a schematic side view of a transport device 610 and a support device 620 according to embodiments described herein.

According to some embodiments, which can be combined with other embodiments described herein, the transport device and the support device can be spaced apart from each other. In particular, the transfer device can be configured to move the solar cell element over a predetermined distance from the transport device to the support device.

According to some embodiments, which can be combined with other embodiments described herein, the transport device 610 and the support device 620 can overlap with each other by a distance D, for example, in the horizontal direction, without a contact between the transport device 610 and the support device 620. As an example, the belt(s) of the transport device 610 and the belt(s) of the support device 620 can overlap while not contacting each other. A distance for transferring the solar cell element from the transport device 610 to the support device 620 can be minimized. A footprint of the apparatus can be reduced and a throughput of the apparatus can be increased, particularly since the reduced distance which the solar cell element has to be transported allows for an increased number of solar cell elements that can be transported per time.

Figure 7:
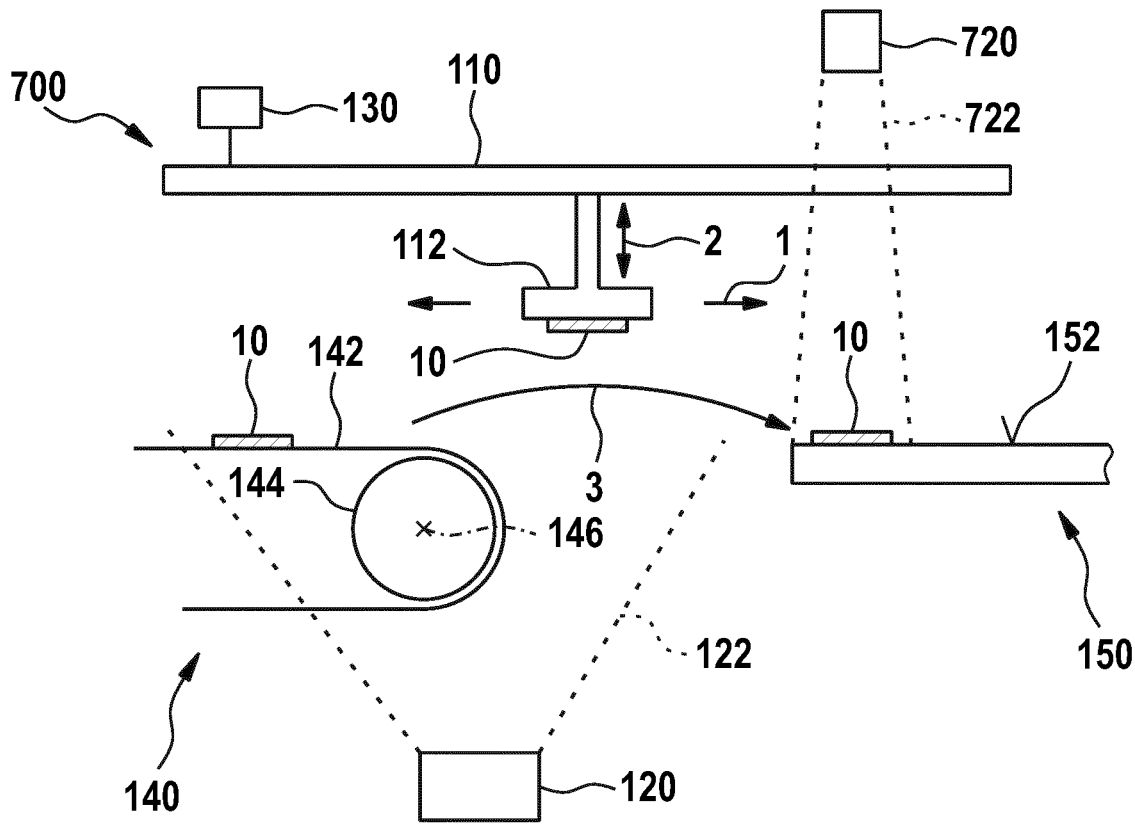
FIG. 7 shows a schematic side view of an apparatus for aligning a solar cell element according to embodiments described herein.

FIG. 7 shows a schematic side view of an apparatus 700 for aligning a solar cell element according to embodiments described herein.

According to some embodiments, which can be combined with other embodiments described herein, the detection device 120 is configured to detect a third orientation of the solar cell element 10 on the support device 150. As an example, one or more further cameras 720 can be positioned above the support device 150 to detect the third orientation of the solar cell element 10 after the solar cell element 10 has been put on the support device 620. As an example, the one or more further cameras 720 can be positioned such that the solar cell element 10 resting on the support device 150 is positioned within a field of view 722 of the one or more further cameras 720. In some implementations, only the one or more further cameras 720 are provided for detecting the third orientation. In further implementations, the one or more further cameras 720 and one or more further elements, such as the one or more light source devices described with respect to FIGS. 4 and 5 are provided.

The determining of the third orientation of the solar cell element 10 can be performed similarly or even identically to the determining of the first orientation and/or the second orientation. In particular, the one or more further cameras 720 can be configured to detect edges or corners of the solar cell element 10 to determine the third orientation.

In some implementations, the controller 130 is configured for closed-loop control to control a movement of the transfer device 110 based on at least the third orientation of the solar cell element 10 when moving a subsequent solar cell element from the transport device 140 to the support device 150. In particular, the third orientation of the solar cell element 10 can be used to improve a transfer and alignment process of the subsequent solar cell element. As an example, after placing the solar cell element 10 on the support device 150, the one or more further cameras 720 can check the positions of one or more edges or corners of the solar cell element 10. Using this information, pick up movements for subsequent solar cell elements at the transport device 140 can be modified in order to correct the detected misalignment of the solar cell element 10 on the support device 150 for the subsequent solar cell element.

According to some embodiments, which can be combined with other embodiments described therein, the apparatus 700 can be configured to determine a quality of the solar cell element 10 based on information acquired by the detection device 120. In particular, a quality may be determined based on whether a geometric shape, such as a contour, of the solar cell element 10 is within a predetermined threshold. As an example, one or more edges of the solar cell element 10 can be detected by the detection device 120. The apparatus 700 can be configured to determine irregularities (e.g., nicks) at the one or more edges of the solar cell element 10. In particular, the one or more edges should be substantially straight lines. If it is detected that a straightness of a portion of the one or more edges deviates by more than a predetermined threshold from a substantially straight line, it is determined that an irregularity exists.

Figure 8:
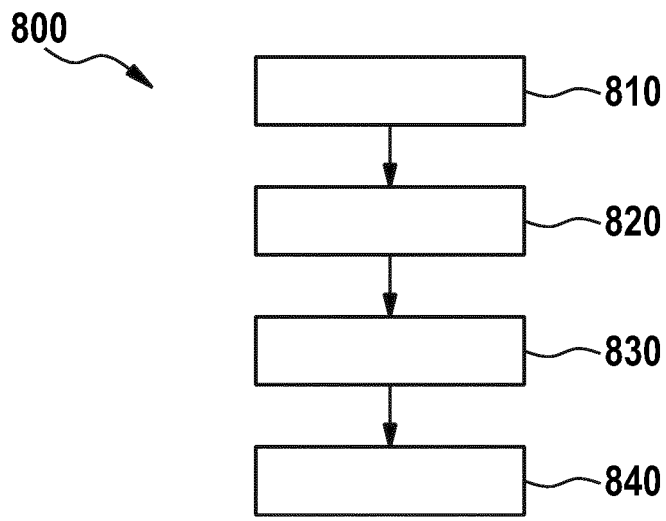
FIG. 8 shows a flow chart of a method for aligning a solar cell element according to embodiments described herein.

FIG. 8 shows a flow chart of a method 800 for aligning a solar cell element according to embodiments described herein. The method 800 can utilize the apparatuses and systems according to the embodiments described herein. Likewise, the apparatuses and systems can utilize the method 800.

The method 800 includes in block 810 detecting a first orientation of the solar cell element positioned on a transport device, in block 820 moving the solar cell element away from the transport device using a transfer device, in block 830 detecting a second orientation of the solar cell element held by the transfer device, and in block 840 changing an orientation of the solar cell element based on at least one of the first orientation and the second orientation to align the solar cell element. The method 800 can further include placing the aligned solar cell element on a support device, such as a belt.

According to some embodiments, the method 800 further includes changing an orientation of the transfer device based on the first orientation of the solar cell element before picking up the solar cell element by the transfer device from the transport device for moving the solar cell element away from the transport device. In particular, the transfer device, such as the gripper thereof, can be aligned with respect to solar cell element to allow for an improved pickup action. As an example, the gripper can be aligned with respect to a surface of the solar cell element that is to be contacted by the gripper.

According to some embodiments, which can be combined with other embodiments described herein, changing the orientation of the solar cell element includes changing the orientation of the solar cell element based on the second orientation (and optionally based on the third orientation of a proceeding solar cell element as described with respect to FIG. 7) and/or moving the solar cell element in at least one of x-, y-, z-, and theta-direction. As an example, the x- and y-direction can define the horizontal plane. The z-direction can be a vertical direction. The movement in the theta-direction can correspond to a movement of the solar cell element and the horizontal plane. Such a movement can also be referred to as a "Θ movement". In particular, the transfer device, and particularly the gripper, is movable in the theta-direction for moving the solar cell element in the theta-direction.

According to embodiments described herein, the method for aligning a solar cell element can be conducted using computer programs, software, computer software products and the interrelated controllers, which can have a CPU, a memory, a user interface, and input and output devices being in communication with the corresponding components of the apparatus for processing a large area substrate.

The present disclosure uses a double-detection of an orientation of a solar cell element to align the solar cell element, for example, in a process of assembling a solar cell arrangement used in a solar cell module. In particular, the solar cell element is put on a support device, for example, to assemble solar cell arrangement, wherein during the process of transferring the solar cell element to the support device an orientation of the solar cell element is detected at least twice in order to improve the transfer process. Specifically, the solar cell element can be brought into a predetermined orientation before the solar cell element is put on the support device.

While the foregoing is directed to embodiments of the disclosure, other and further embodiments of the disclosure may be devised without departing from the basic scope thereof, and the scope thereof is determined by the claims that follow.

The invention claimed is:

1. Apparatus for aligning a solar cell element, comprising:
   a gripper configured for moving the solar cell element from a first position on a transport device to a second position on a support device;
   a detection device configured to detect a first orientation of the solar cell element on the transport device and configured to detect a second orientation of the solar cell element held by the gripper; and
   a controller configured to change an orientation of the solar cell element held by the gripper based on at least one of the first orientation and the second orientation to align the solar cell element.

2. The apparatus of claim 1, wherein the controller is configured to change an orientation of the gripper based on the first orientation of the solar cell element on the transport device before picking up the solar cell element from the transport device.

3. The apparatus of claim 2, wherein the detection device is configured to detect at least one of one or more edges or corners of the solar cell element and printing features on the solar cell element to detect at least one of the first orientation and the second orientation.

4. The apparatus of claim 3, wherein the detection device includes at least one of one or more cameras and one or more light source devices.

5. The apparatus of claim 4, wherein the one or more light source devices include one or more light sources arranged in direct line of sight to the one or more cameras, wherein the one or more light sources are selected from the group consisting of lamps, light tapes, flash lights, light bars, and any combination thereof.

6. The apparatus of claim 4, wherein the one or more light source devices include one or more light sources and one or more light diffusion devices, wherein the one or more light diffusion devices are arranged in direct line of sight to the one or more cameras, and wherein the one or more light sources are configured to direct light towards the one or more light diffusion devices.

7. The apparatus of claim 6, wherein the detection device is configured to detect a third orientation of the solar cell element on the support device, and wherein the controller is configured for closed-loop control to control a movement of the gripper based on at least the third orientation of the solar cell element when moving a subsequent solar cell element from the transport device to the support device.

8. The apparatus of claim 7, wherein at least one of the gripper is configured to pick up the solar cell element from the gripper to move the solar cell element from the first position to the second position, and the gripper is selected from the group consisting of: a mechanical gripper, a pneumatic gripper, an electrostatic gripper, an electrodynamic gripper, a vacuum gripper, and any combination thereof.

9. The apparatus of claim 1, wherein the detection device is configured to detect at least one of one or more edges or corners of the solar cell element and printing features on the solar cell element to detect at least one of the first orientation and the second orientation.

10. The apparatus of claim 1, wherein the detection device is configured to detect a third orientation of the solar cell element on the support device, and wherein the controller is configured for closed-loop control to control a movement of the gripper based on at least the third orientation of the solar cell element when moving a subsequent solar cell element from the transport device to the support device.

11. The apparatus of claim 1, wherein at least one of the gripper is configured to pick up the solar cell element from the transport device to move the solar cell element from the first position to the second position, and the gripper is selected from the group consisting of: a mechanical gripper, a pneumatic gripper, an electrostatic gripper, an electrodynamic gripper, a vacuum gripper, and any combination thereof.

12. System for use in the manufacture of a solar cell, comprising:
　an apparatus for aligning a solar cell element, comprising:
　　a gripper configured for moving the solar cell element from a first position on a transport device to a second position on a support device;
　　a detection device configured to detect a first orientation of the solar cell element on the transport device and configured to detect a second orientation of the solar cell element held by the gripper; and
　　a controller configured to change an orientation of the solar cell element held by the gripper based on at least one of the first orientation and the second orientation to align the solar cell element;
　wherein the transport device configured to provide the first position; and
　wherein the support device configured to provide the second position.

13. The system of claim 12, wherein at least one of the transport device and the support device are selected from the group consisting of a conveyor belt, a vacuum chuck, an electrostatic chuck, an electrodynamic chuck, and any combination thereof.

14. The system of claim 13, wherein at least one of one or more cameras of the detection device are arranged below the transport device and the gripper is arranged above the transport device.

15. The system of claim 12, wherein at least one of one or more cameras of the detection device are arranged below the transport device and the gripper is arranged above the transport device.

16. Method for aligning a solar cell element, comprising:
　detecting a first orientation of the solar cell element positioned on a transport device;
　moving the solar cell element away from the transport device using a gripper;
　detecting a second orientation of the solar cell element held by the gripper; and
　changing an orientation of the solar cell element based on at least one of the first orientation and the second orientation to align the solar cell element.

17. The method of claim 16, further including:
　changing an orientation of the gripper based on the first orientation of the solar cell element before picking up the solar cell element by the gripper from the transport device for moving the solar cell element away from the transport device.

18. The method of claim 16, wherein changing the orientation of the solar cell element includes at least one of:
　changing the orientation of the solar cell element based on the second orientation; and
　moving the solar cell element in at least one of x-, y-, z-, and theta-direction.

19. The method of claim 18, further including: placing the aligned solar cell element on a support device.

20. The method of claim 16, further including:
　placing the aligned solar cell element on a support device.

* * * * *